United States Patent [19]

Politycki et al.

[11] 4,048,954

[45] Sept. 20, 1977

[54] COATING DEVICE FOR SMALL ELECTRICALLY CONDUCTIVE COMPONENTS

[75] Inventors: Alfred Politycki, Ottobrunn; Konrad Hieber, Munich, both of Germany

[73] Assignee: Siemens Aktiengesellschaft, Berlin & Munich, Germany

[21] Appl. No.: 715,940

[22] Filed: Aug. 19, 1976

[30] Foreign Application Priority Data

Sept. 4, 1975 Germany .............................. 2539434

[51] Int. Cl.$^2$ ............................................ C23C 13/08
[52] U.S. Cl. ................................................. 118/49.1
[58] Field of Search .................... 118/48, 49, 49.1, 50, 118/49.5; 427/242

[56] References Cited

U.S. PATENT DOCUMENTS

| | | | |
|---|---|---|---|
| 3,389,070 | 6/1968 | Berghaus et al. | 118/49.5 X |
| 3,464,846 | 9/1969 | Mattson | 118/48 X |
| 3,696,779 | 10/1972 | Murai et al. | 118/48 |
| 3,900,597 | 8/1975 | Chruma et al. | 118/48 X |

*Primary Examiner*—Ronald Feldbaum
*Attorney, Agent, or Firm*—Hill, Gross, Simpson, Van Santen, Steadman, Chiara & Simpson

[57] ABSTRACT

Apparatus for completely coating small metal components wherein a rotatable chamber is positioned within a gas-tight vessel, both being electrically non-conductive members. Inductive heating means surrounds the vessel. Electrically conductive components being coated are deposited in the chamber and tumbled therein at elevated temperatures while thermally decomposable gas bathes such components.

14 Claims, 1 Drawing Figure

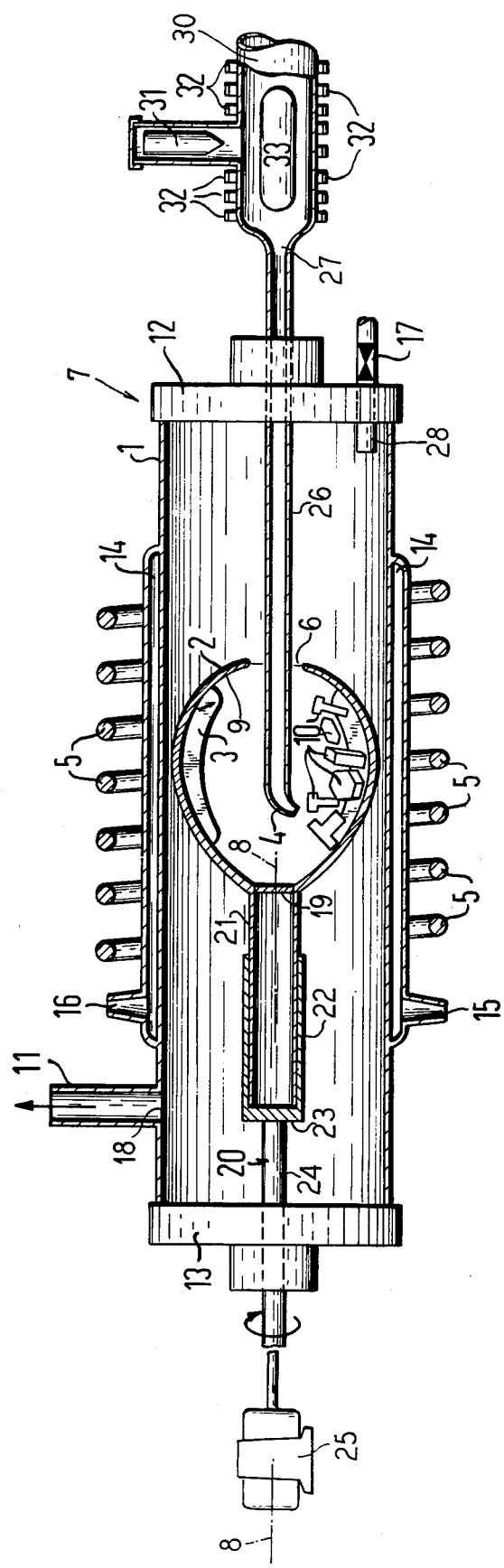

COATING DEVICE FOR SMALL ELECTRICALLY CONDUCTIVE COMPONENTS

BACKGROUND OF THE INVENTION

Many arrangements for coating small metal components have already been described, as shown for instance in the article by E. Fitzer, W. Fritz and D. Kehr, "Struktur und Eigenschaften von CVD-Schichten" in the periodical VDI-Zeitschr. 114 (1972) no. 16, Nov., p. 1221 onwards. With the methods and apparatus illustrated there, local temperature differences often arise in a component substrate, and, in addition, turbulence can build up between the gaseous reagents employed, so that the rates of chemical separation and deposition are not uniform. Consequently, the coatings produced in any given instance can become very uneven, and some zones on the components undergoing a given coating operation can remain totally exposed (uncoated), such as areas on holders, or on the backs of components, or the like.

For coating small components, use has been made, for example, of rotary reaction vessels heated exteriorly in which chemical separation results in deposits predominantly on the inside walls of the reaction vessel, such deposits being transferred to the components partly by friction. However, in such a coating system, the adhesive bond between a resulting coating and an individual small component is impaired.

BRIEF SUMMARY OF THE INVENTION

The present invention aims primarily to provide apparatus with which small metal and/or electrically conductive components can be coated completely in an environment wherein decomposition of gas releases a particulate coating material which deposits on such components.

This object is achieved by disposing a rotatable, electrically non-conductive reaction chamber in a gas-tight, electrically non-conductive vessel which is provided with circumscribing electric inductive heating coils. Input conduit means for discharging thermally decomposable, preselected reaction gas into such reaction chamber is provided, together with output conduit means for removing gaseous material from such vessel. Heated electrically conductive components tumbled in such chamber and exposed to such a gas are completely coated.

Other and further objects, aims, purposes, features, advantages and utilities of the present invention will be apparent to those skilled in the art from the present specification taken with the appended drawing.

BRIEF DESCRIPTION OF THE DRAWINGS

In the drawings:

The FIGURE provides a diagrammatic, longitudinal sectional view with some parts thereof being shown in elevation.

DETAILED DESCRIPTION OF THE DRAWINGS

Referring to the drawings, there is seen one embodiment of apparatus of this invention herein designated in its entirety by the numeral 7. The apparatus employs a gas-tight vessel 1 defining therewithin an evacuatable reaction chamber positioned within vessel 1 is a drum member or second vessel 2. Drum member 2 has a longitudinal axis 8 and continuously, interiorly, concavely curved side walls 9. The side walls 9 can be spherically shaped and drum member 2 can be comprised of quartz or the like. As in the embodiment shown, drum member 2 is preferably provided with radially inwardly projecting, longitudinally extending rib members 3 associated with the side walls 9. An aperture 6 is defined in one end region of drum member 2 about the axis 8.

Vessel 1 is located exteriorly, as shown, about the drum member 2, and preferably is in equally spaced relationship thereto. Portions of the vessel 1 adjacent the drum member 2 are comprised of electrically non-conductive material. Vessel 1 has a gas output orifice 18 defined therein which is conveniently directly interconnected with an outlet conduit 11. Preferably, and as shown, vessel 1 is cylindrical in configuration and has the cylindrical side wall portions thereof in such an adjacent relationship to the drum member 2. Such cylindrical side wall portions are comprised of such electrically non-conductive material, such as a ceramic or the like, and such cylindrical side wall portions at opposed ends thereof are provided with cap members 12 and 13 each of which makes a sealing engagement with such cylindrical side wall portions. If desired, such cap members can be comprised of metal since, as will be seen from the following description, such cap portions are located outside of the inductively heated region circumscribing the drum member 2.

A shaft arrangement 20 is associated fixedly with drum member 2 and axially extends outwardly from the opposed end region 19 of drum member 2 (relative to the end region of drum member 2 wherein aperture 6 is located). The shaft arrangement 20 extends through a wall portion of vessel 1, and shaft arrangement 20 is adapted for axial rotational movements. The portion 21 of shaft arrangement 20 adjacent to and connected with drum member 2 is comprised of electrically non-conductive material. Portion 21 is here shown to have a tubular configuration; portion 21 on side wall regions thereof engages a sleeve member 22 which engages portion 21 so that sleeve member 22 and portion 21 can rotate together coaxially. If desired, sleeve member 22 can be formed of a metal. Sleeve member 22 terminates in an end plate 23 which, in turn, is joined to a solid shaft member 24. End plate 23 and shaft member 24 can be formed of metal. Shaft member 24 axially extends through cap member 13 with appropriate seals being provided therebetween. Bearing means (not shown) adapt the shaft member 24 for rotational movements relative to vessel 1 thereby permitting drum member 2 to be rotatably driven by the shaft arrangement 20.

An electric inductive heating coil 5 exteriorly circumscribes vessel 1 about portions thereof adjacent the drum member 2. A high frequency current is passable through coil 5 so that electrically conducting small components 10 positioned in drum member 2 are heatable to a predetermined temperature thereby.

An electric motor 25 serves as a power head which is functionally associated with the shaft arrangement 20 and specifically is interconnected with the shaft member 24 exteriorly of vessel 1 thereby adapting the shaft arrangement 20 to be rotatably driven by motor 25.

A conduit 26, which can be comprised of a vitreous material such as glass or the like, is provided for delivering a thermally decomposable gas into the drum member 2. Conduit 26 extends continuously from a position exteriorly located with respect to vessel 2 through a wall portion of vessel 2 and also through the aperture 6 of drum member 2. In apparatus 7, conduit 26 extends axially through cap member 12 and sealing means are provided between the conduit 26 and cap member 12. In drum member 2, conduit 26 terminates in an output orifice 4 which is preferably in the form of a nozzle that is directed towards side walls 9 of drum member 2. The end of conduit 26 located exteriorly of vessel 2 connects with a gas output port 27 of a gas type receptacle 30.

Receptacle 30 is adapted to hold a reservoir of vaporizable, thermally decomposable material. Receptacle 30 is provided with a heating coil 32 adapted to be electrically resistance heated in this embodiment to a prechosen temperature. Receptacle 30 is further provided with a gas input port (not shown) so that a sweep gas can be passed to and through receptacle 30 and out via output port 27.

Apparatus 7 preferably includes a fluid-tight jacket 14 circumscribing such in regions thereof adjacent drum member 2. Thus, in apparatus 7, jacket 14 circumferentially extends about cylindrical wall portions of vessel 1 with induction coil 5 being located in radially outwardly adjacent relationship thereto. The jacket 14 is provided with input and exit ports 15 and 16, respectively, so that a temperature regulating fluid can be circulated through the jacket 16. Thus, the walls of vessel 1 adjacent the drum member 2 are maintainable at predetermined temperatures below a decomposition temperature associated with a thermally decomposable gas being charged to and utilized within apparatus 7 in accordance with the teachings of the present invention. Jacket 14 thus avoids deposits developing upon the interior walls of the vessel 1. Suitable fluids include such materials as cold water or hot paraffin oil, the selection of fluid in any given instance depending upon the temperatures to be maintained.

To insure that reactions requiring a higher temperature than that which can be tolerated by a material employed in the walls of vessel 1 do not occur under normal operating conditions, an emergency cooling gas input conduit 28 is provided which extends through cap member 12 in sealing engagement therewith and which terminates in a mouth located in adjacent relationship to inside walls of the vessel 1. Emergency conduit 28 is provided with a valve member 17. If and when valve member 17 is opened, a cooling gas, such as nitrogen or other inert gas, can be injected into and blown over inside wall portions of vessel 1; like gaseous materials introduced into drum member 2 via nozzle 4, and gaseous decomposition products, such a cooling gas is removed from vessel 1 via the aperture 18.

The following exemplifies one manner in which small components 10 can be coated with apparatus 7 with, for example, tantalum. A tantalum coating is producible by utilizing the following reaction:

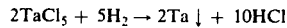

2TaCl$_5$ + 5H$_2$ → 2Ta ↓ + 10HCl

Here the reaction temperature, or temperature of decomposition of the tantalum chloride in the presence of hydrogen, is in excess of 600° C. Thus, tantalum is deposited upon the small components 10 when such are heated to a temperature of over 600° C and when a mixture of tantalum chloride and hydrogen is blown over such small components 10 through the nozzle 4. The hydrogen chloride byproduct formed is drawn off through the outlet conduit 11 from the vessel 1.

When coating with tantalum, the following procedure is usable: First, vessel 1 is evacuated to about 10$^{-8}$ bar. Next, the interior of vessel 1 is flooded with hydrogen until a pressure of about 0.5 bar is established.

Then, tantalum chloride is admixed with the stream of hydrogen being charged to drum 2 via conduit 26 and the small components 10 are heated to a temperature in the range from about 600° C to 800° C by means of induction coil 5. The result is that tantalum is deposited upon the components 10.

Since tantalum chloride is not resistant to air, the following handling procedure therefor is employed: tantalum chloride is charged under a pressure of about 10$^{-5}$ bar through ampuls which are then sealed by fusion. Such an ampul 33 so sealed is positioned within receptacle 30 and hydrogen gas is supplied or swept through receptacle 30 and out through nozzle 4. By means of an impact device, here, for example, shown as a magnetic plunger 31, ampul 33 is ruptured and tantalum chloride is permitted to escape therefrom and be mixed with the stream of hydrogen. By means of a receptacle heater 32 located circumferentially in a coiled manner about receptacle 30 in the region thereof holding ampul 33, the ampul 33 and its contents are heated to about 120° C so that the tantalum chloride vaporizes at a particularly uniform rate, as desired.

A device of this invention, such as apparatus 7, can also be advantageously used for the application of other types of coatings, for examples, metal coatings of nickel, copper, titanium, molybdenum, tungsten and the like, and inorganic non-metallic coatings, such as, for examples, those comprising carbide, nitride, oxides and the like. Such coatings can be produced through the decomposition of such vaporizable, initially solid compounds as metallic acetylacetonates, carbonyls, halogenides and the like. Thus, with apparatus of the present invention, a wide variety of decomposition reactions can be employed, such as those illustrated in the following equations. In such equations, the first named substance on the lefthand side of each equation is placed in an ampul, such as ampul 33 which is then inserted into a reservoir or receptacle 30, as hereinabove illustrated and explained. The ampul is ruptured and mixed with a prechosen gas usually the gas with which a reaction is to occur, as illustrated in the equations below, hydrogen being a particularly common such gas. The vertical arrow behind an element or compound on the righthand side of a reaction equation below indicates that such substance is deposited (coated) on small components, such as small components 10. For each equation, T is the decomposition temperature to which such small components are heated in accordance with the practice of the present invention:

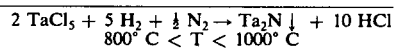

2 TaCl$_5$ + 5 H$_2$ + ½ N$_2$ → Ta$_2$N ↓ + 10 HCl
800° C < T < 1000° C

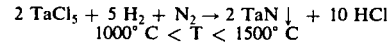

2 TaCl$_5$ + 5 H$_2$ + N$_2$ → 2 TaN ↓ + 10 HCl
1000° C < T < 1500° C

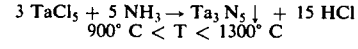

3 TaCl$_5$ + 5 NH$_3$ → Ta$_3$N$_5$ ↓ + 15 HCl
900° C < T < 1300° C

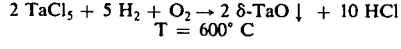

2 TaCl$_5$ + 5 H$_2$ + O$_2$ → 2 δ-TaO ↓ + 10 HCl
T = 600° C

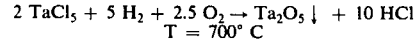

2 TaCl$_5$ + 5 H$_2$ + 2.5 O$_2$ → Ta$_2$O$_5$ ↓ + 10 HCl
T = 700° C

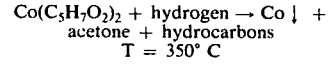

Co(C$_5$H$_7$O$_2$)$_2$ + hydrogen → Co ↓ +
acetone + hydrocarbons
T = 350° C

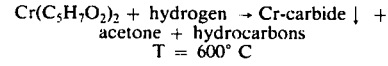

Cr(C$_5$H$_7$O$_2$)$_2$ + hydrogen → Cr-carbide ↓ +
acetone + hydrocarbons
T = 600° C -continued

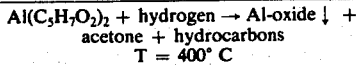
$$Al(C_5H_7O_2)_2 + \text{hydrogen} \rightarrow \text{Al-oxide} \downarrow + \text{acetone} + \text{hydrocarbons}$$
$$T = 400° C$$

In the following equations, a mixture comprising hydrogen and nitrogen can be used instead of hydrogen:

$$2 TiCl_3 + 3 H_2 \rightarrow 2 Ti \downarrow + 6 HCl$$
$$T = 900° C$$

$$TiCl_4 + 2 H_2 \rightarrow Ti \downarrow + 4 HCl$$
$$T = 900° C$$

$$2 MoCl_5 + 5 H_2 \rightarrow 2 Mo \downarrow + 10 HCl$$
$$T = 800° C$$

$$WCl_6 + 3 H_2 \rightarrow W \downarrow + 6 HCl$$
$$T = 900°C$$

$$WF_6 + 3 H_2 \rightarrow W \downarrow + 6 HF$$
$$T = 1000° C$$
preferentially 400° C = T = 1000° C $$2 TiCl_4 + 4 H_2 + N_2 \rightarrow 2 TiN \downarrow + 8 HCl$$
$$T = 900° C$$

$$TiCl_4 + \text{hydrogen} + \text{methane} \rightarrow TiC \downarrow + HCl$$
$$T = 900° C$$

$$TiCl_4 + 2 H_2 + O_2 \rightarrow TiO_2 \downarrow + 4 HCl$$
$$T = 900° C$$

Other and further objects, aims, purposes, advantages, embodiments and the like will be apparent to those skilled in the art without departing from the spirit and scope of the present invention.

Excellent results have been gained by application of the invention in coating of so-called loose material as screws and nuts from 1 mm to 15 mm and generally of for instance longitudinal parts up to 8 mm in diameter and up to 100 mm length.

We claim:
1. Apparatus for coating electrically conductive small components comprising
    A. an electrically non-conductive drum member having
        1. a longitudinal axis
        2. continuously interiorly concavely curved side walls,
        3. radially inwardly projecting longitudinally extending rib members associated with said side walls, and
        4. an aperture defined in one end region thereof about said axis,
    B. a gas-tight vessel located exteriorly about said drum member in spaced relationship thereto, portions of said drum member adjacent said vessel being electrically non-conductive, said vessel having a gas output orifice defined therein,
    C. shaft means associated fixedly with said drum member and axially extending outwardly from the opposed end region thereof through a first wall portion of said vessel, said shaft means including sealing means therefor adjacent said first wall portion, said shaft means being electrically non-conductive in regions thereof adjacent said drum member, said shaft means including bearing means adapting said shaft means for axial rotational movements,
    D. a power head functionally associated with said shaft means exteriorly of said vessel and adapted to drive rotatably said shaft means,
    E. electric inductive heating coil means circumscribing said vessel about portions thereof adjacent said drum member, and
    F. conduit means for delivering a thermally decomposable gas into said first vessel, said conduit means extending continuously from a position exteriorly of said vessel through a second wall portion of said vessel and through said aperture, said conduit means terminating in an output orifice in said drum member, said conduit means including sealing means therefor adjacent said second wall portion.

2. The apparatus of claim 1 wherein said output orifice terminates in a nozzle which is directed towards said side walls.

3. The apparatus of claim 1 wherein said conduit means at said position functionally connects a gas output port defined in a gas-tight receptacle means for holding a reservoir of vaporizable, thermally decomposable material which upon such decomposition releases a particulate solid, said receptacle means including
    1. heating means for maintaining said material at a prechosen temperature, and
    2. respective gas input and output ports defined therein.

4. The apparatus of claim 1 wherein said vessel has fluid-tight jacket means circumscribing same in regions thereof adjacent said drum member, said jacket means including input and exit port means, said jacket means being adapted for the circulation therethrough of temperature regulating fluid, whereby said vessel in regions thereof adjacent said drum member is maintainable at predetermined temperatures below a decomposition temperature of gas charged thereinto via said conduit means.

5. The apparatus of claim 1 wherein said vessel is provided with an emergency input conduit means which sealingly extends through a third wall portion thereof and which has a terminal mouth located in adjacent relationship to inside walls of said vessel, and valve means for said emergency conduit means, whereby an inert cooling gas can be blown over said inside walls to maintain said inside walls below predetermined maximum temperatures.

6. The apparatus of claim 1 wherein said vessel is cylindrical in configuration and has the cylindrical wall portions thereof adjacent said first vessel, said cylindrical wall portions being comprised of such electrically non-conductive material and also has opposed end wall portions thereof separately formed, said shaft means extending through one of said end wall portions, said conduit means extending through another of said end wall portions.

7. The apparatus of claim 3 wherein said gas-tight receptacle means is additionally provided with means for rupturing ampule means disposed within said receptacle means.

8. The apparatus of claim 1 wherein said drum member is comprised of quartz.

9. The apparatus of claim 1 wherein said drum member is generally provided with spherical said side walls.

10. The apparatus of claim 1 wherein said rupturing means is magnetic.

11. The apparatus of claim 1 wherein said heating means comprises an electric resistance heater.

12. Apparatus for coating electrically conductive small components comprising
A. an electrically non-conductive first vessel having
1. a longitudinal axis,
2. continuously interiorly concavely curved side walls,
3. radially inwardly projecting longitudinally extending rib members associated with said side walls,
4. an aperture defined in one end region thereof about said axis
B. a gas-tight second vessel located exteriorly about said first vessel in spaced relationship thereto, portions of said second vessel adjacent said first vessel being electrically non-conductive, said second vessel having a gas output orifice defined therein,
C. shaft means associated fixedly with said first vessel and axially extending outwardly from the opposed end region thereof through a first wall portion of said second vessel, said shaft means including sealing means therefor adjacent said first wall portion, said shaft means being electrically non-conductive in regions thereof adjacent said first vessel, said shaft means including bearing means adapting said shaft means for axial rotational movements,
D. a power head functionally associated with said shaft means exteriorly of said second vessel and adapted to drive rotatably said shaft means,
E. electric inductive heating coil means circumscribing said second vessel about portions thereof adjacent said first vessel, and
F. gas-tight receptacle means exterior of said second vessel for holding a reservoir of vaporizable, thermally decomposable material which upon gas phase decomposition releases a particulate product, said receptacle means including heating means for maintaining said material at a prechosen temperature and respective gas input and output ports defined therein,
G. conduit means for delivering said material in a gas phase from said receptacle means into said second vessel, said conduit means extending from said gas input port through second wall portion of said second vessel and through said aperture, said conduit means terminating in said first vessel in an output orifice, said conduit means including sealing means therefor adjacent said second wall portion, and
H. fluid-tight jacket means circumscribing said second vessel in regions thereof adjacent said first vessel, said jacket means including entrance and exit port means, said jacket means being adapted for the circulation therethrough of temperature regulating fluid.

13. The apparatus of claim 12 wherein said second vessel is cylindrical in configuration and has the cylindrical wall portions thereof adjacent said first vessel, said cylindrical wall portions being comprised of electrically non-conductive material, and also has opposed end wall portions thereof separately formed, said shaft means extending through one of said end wall portions, said conduit means extending through another of said wall portions.

14. The apparatus of claim 13 wherein said second vessel is provided with an emergency input conduit which sealingly extends through a third wall portion thereof and which has a terminal mouth located in adjacent relationship to inside walls of said second vessel, and valve means for said emergency conduit, whereby an inert cooling gas can be blown over said inside walls to maintain said walls below predetermined maximum temperatures.

* * * * *